United States Patent
Du et al.

(10) Patent No.: US 10,944,406 B1
(45) Date of Patent: Mar. 9, 2021

(54) CLOCK AND DATA RECOVERY USING CLOSED-LOOP CLOCK ALIGNMENT AND DUPLICATE SAMPLING CLOCK

(71) Applicant: Synopsys, Inc., Mountain View, CA (US)

(72) Inventors: Zhenchang Du, Portland, OR (US); Choon H. Leong, Portland, OR (US); David A. Yokoyama-Martin, Portland, OR (US); John T. Stonick, Portland, OR (US); Skye Wolfer, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/654,931

(22) Filed: Oct. 16, 2019

Related U.S. Application Data (60) Provisional application No. 62/746,591, filed on Oct. 17, 2018.

(51) Int. Cl.
  *H03L 7/08*    (2006.01)
  *H04L 7/033*   (2006.01)
  *H03L 7/099*   (2006.01)
  *H03L 7/081*   (2006.01)
  *H03L 7/07*    (2006.01)

(52) U.S. Cl.
  CPC ............ *H03L 7/0807* (2013.01); *H03L 7/07* (2013.01); *H03L 7/0814* (2013.01); *H03L 7/0998* (2013.01); *H04L 7/033* (2013.01)

(58) Field of Classification Search
  CPC ..... H04L 7/033; H04L 7/0087; H04L 7/0331; H04L 7/0008; H04L 7/0337

USPC .......................................................... 375/355
See application file for complete search history.

(56) References Cited

U.S. PATENT DOCUMENTS

| | | | | |
|---|---|---|---|---|
| 6,928,128 B1 * | 8/2005 | Sidiropoulos | .......... | H03K 5/133 327/157 |
| 7,149,856 B2 * | 12/2006 | Garlepp | .............. | G06F 13/1689 711/156 |
| 2010/0322367 A1 * | 12/2010 | Wenske | ................ | H03L 7/0807 375/373 |
| 2019/0011945 A1 * | 1/2019 | Fayneh | ..................... | G06F 1/08 |

* cited by examiner

*Primary Examiner* — Shuwang Liu
*Assistant Examiner* — Gina M McKie
(74) *Attorney, Agent, or Firm* — Bever, Hoffman & Harms, LLP (57) ABSTRACT

A CDR method/circuit utilizes a closed-loop clock alignment circuit and a duplicate clock to align a sampling point clock to both mid-interval and optimal sample point phases during data receiving processes. An initial clock is generated having the mid-interval sampling point phase, then the closed-loop clock alignment circuit generates a phase correction signal based on a phase difference between the data sampling clock and the initial clock, and then the phase correction signal is fed back to a high-speed phase mixer to adjust/align the sampling point clock to the initial clock. Subsequently, the duplicate clock is generated and utilized to determine an optimal sampling point phase while the data sampling clock is utilized to read the received data signal, and then the closed-loop clock alignment circuit is re-used to re-align the data sampling clock to the duplicate clock when the optimal sampling point phase is identified.

19 Claims, 7 Drawing Sheets

CLOCK AND DATA RECOVERY USING CLOSED-LOOP CLOCK ALIGNMENT AND DUPLICATE SAMPLING CLOCK

RELATED APPLICATIONS

This application claims priority from U.S. Provisional patent application 62/746,591, entitled "Methodology to Line Up Clocks at Given Phase Relationship", which was filed on Oct. 17, 2018, and is incorporated by reference herein.

FIELD OF THE INVENTION

The present invention relates to transceiver circuits used to facilitate data transmissions between distinct circuit blocks in integrated circuit (IC) devices. More specifically, this invention relates to clock and data recover (CDR) circuits that are utilized by transceivers in IC devices.

BACKGROUND OF THE INVENTION

The growth of cloud computing, social media, and online streaming has created an increasing demand for ever-faster data transfer rates, and wireline transceivers are still the fastest and most cost-effective circuits for transferring data between computers, storage, servers, and even different blocks inside a single IC device (chip). Within a single IC device (e.g., an application specific integrated circuit (ASIC) or system-on-chip (SoC) fabricated on a semiconductor substrate using CMOS fabrication techniques), data transmissions using wireline transceivers typically involve the generation/transmission of data signal onto a wire or other conductive path by a source (upstream) circuit block, and the reception of the data signal from the wire/path by a destination (downstream) circuit block. The data signal is typically generated by the data transmission portion of a first transceiver disposed in the source circuit block, where the data signal includes a message-specific series of periodically spaced voltage levels that indicate different possible data values. The data signal is received by the data reception portion of a second transceiver disposed in (or otherwise associated with) the destination circuit block and is converted by back into the message-specific series of binary "0" and "1" values, which are then processed by functional circuitry in the designation circuit block.

Wireline transceivers of the type discussed herein require the use of clock and data recovery (CDR) circuits to accurately read the digital data conveyed in each received data signal. That is, each data signal is generated by a source circuit block using a localized reference clock signal (that is, the reference clock signal is local to the source signal block and is not transmitted or otherwise shared with the destination circuit block). Accordingly, in order to properly interpret each received data signal, the receiving transceiver utilizes a CDR circuit to recover (reconstruct) the reference clock signal using only the received data signal in order to determine the proper sampling point needed to read the data bit transmitted with each associated data unit interval of the data signal. Accordingly, CDR circuits are key building blocks in wireline transceivers that enable a host transceiver to interpret (read) a received data signal by generating a primary sampling point clock signal that allows the transceiver to sample the received data signal once during each data unit interval, thereby allowing the transceiver to accurately detect/decode the stream of data bits contained in the received data signal.

Conventional CDR circuits often utilize two sampling point clock signals including an edge clock signal (often referred to as a Q clock) and an associated sampling point signal (often referred to as an I clock). Conventional CDR circuits typically establish the edge and sampling point clocks by identifying the data unit interval edges of a received data signal using known techniques, aligning the edges of the edge (Q) clock signal with the identified data unit interval edges, and then utilizing the thus-established edge (Q) clock signal to generate an associated sampling point (I) signal by phase-shifting the edge clock 90° (i.e., one-quarter of the reference clock period or one-half of each data unit interval). Note that this approach places the transition edges of the associated sampling point (I) signal in the middle of each data unit interval (i.e., the associated sampling point signal is generated with a mid-interval sampling point phase). In terms of an eye diagram (which are known by those skilled in the art), this approach allows the CDR circuit to sample the data eye center of each data unit interval using the sampling point (I) clock, and to sample each transition edge between sequentially occurring data unit intervals using the edge (Q) clock. In many cases, the sampling point clock produced by the CDR circuit is utilized as a primary sampling point clock signal that is utilized by the host wireline transceiver to read received data signals.

Due to data signal distortion, the mid-interval sampling point utilized by conventional CDR circuits is not always the optimal point within each unit interval for sampling data values. As taught by Ilter Ozkaya et al., "A 60-Gb/s 1.9-pJ/bit NRZ Optical Receiver with Low-Latency Digital CDR in 14-nm CMOS FinFET" (IEEE J. Solid-State Circuits, vol. PP, pp. 1-11, February 2018. DOI: 10.1109/JSSC.2017.2778286, incorporated herein by reference), better transceiver performance can be achieved by fine tuning the sampling point clock phase (position) to a phase/point at which the difference between high (binary "1") signal levels and low (binary "0") signal levels is maximized. For example, FIG. 21 of Ozkaya et al. shows an exemplary eye diagram in which the largest data eye opening (indicated by green arrow) is off-center. If the I and Q clocks are generated with the usual 90° offset, the I clock will sample half way between adjacent EDGEs, which is the dashed red arrow in FIG. 21 of Ozkaya et al. While the effective eye diagram is within the blue eye, it can be seen that the optimal sampling point with the most vertical and horizontal margin is actually where the dashed green arrow lies. This is extremely important: as that data transfer rate of data signals continues to increase, the effective data eye opening of each unit interval (UI) decreases (i.e., becomes shorter in terms of time). Accordingly, there is a growing need for CDR circuits and associated methods that are capable of identifying optimal sample point phases, and capable of modifying a host transceiver's primary sampling point clock signal in a way that minimizes read errors.

Problems associated with conventional CDR circuits that are capable of identifying optimized sample point phases include (a) they utilize clock alignment circuitry that changes the sampling point of the primary sampling point clock signal during identification of an optimized sampling point, (b) they are expensive in terms of requiring a significant amount of chip area and consume a significant amount of power, and (c) they can cause data errors while finding the optimum sample point, and (d) the process of finding the optimal point requires manual intervention.

What is needed are CDR circuits and associated methods that facilitate the generation of primary sampling point clock signals having optimized sampling points while addressing the various problems associated with conventional approaches. More specifically, what is needed is a CDR circuit that facilitates the generation of optimized sampling point phases without causing data read errors, occupies a minimum amount of smaller chip area, and consumes a minimum amount of power.

SUMMARY OF THE INVENTION

The present invention is directed to a CDR method/circuit that utilizes a duplicate (secondary) clock signal to determine an optimal sample point phase for a received data signal, and then utilizes a closed-loop clock alignment circuit to phase-align a primary data sampling clock signal to the optimal sample point phase using the duplicate clock signal. Similar to conventional approaches, the primary data sampling clock signal is provided for use by a host transceiver to read received data signals. Unlike conventional approaches, the duplicate clock signal is generated and is used exclusively within the CDR circuitry to determine optimal sample point phases (i.e., while the CDR circuitry simultaneously provides the primary sampling point clock signal for use in reading received data signals). When the duplicate clock signal identifies and locks onto an optimal sample point phases, the closed-loop clock alignment circuit is utilized to phase-align the primary data sampling clock signal to the duplicate clock signal, whereby the primary data sampling clock signal implements the optimal sample point phase. Because phase-aligning the primary data sampling clock signal to the duplicate clock signal involves a relatively small phase adjustment from its current sample point phase to the newly-identified optimal sample point phases, the CDR method/circuit of the present invention achieves the improved transceiver data read accuracy associated with the use of optimized (i.e., non-mid-interval) sample point phases while avoiding the data-read errors associated with conventional approaches. That is, in order to identify an optimal sample point phase with maximum accuracy, it is necessary to analyze at least a significant portion of the entire 180° phase range between the two data unit interval edges of an associated data signal. When a CDR circuit is configured such that the optimal sample point phase identification process affects the primary sampling point clock signal (i.e., such that the phase of the primary sampling point clock signal is changed/shifted within the 180° data interval phase range in response to the identification process while simultaneously being used to read data signals), a significant number of undesirable read errors are typically generated when the sampling phase approaches the data interval edges. To avoid these errors, conventional CDR circuits must either significantly limit the portion of the 180° data interval phase range swept during optimal sample point phase identification processes, which potentially reduces the accuracy of identified optimal sample point phases, or read operations must be suspended during optimal sample point phase identification processes, which undesirably reduces data transfer rates. The present invention avoids these issues by facilitating maintenance of the primary sampling point clock signal at a pre-designated sampling point, thereby maximizing the data read rate of a host transceiver, while simultaneously facilitating optimal sample point phase identification processes in which the duplicate clock signal is free to analyze the entire 180° data interval phase range, thereby maximizing read accuracy.

According to an aspect of the present invention, the closed-loop clock alignment circuit includes a high-speed phase mixer circuit and one or more phase analysis circuit structures coupled in a closed-loop arrangement such that the high-speed phase mixer circuit transmits the primary sampling point clock signal to the phase analysis circuit structures, and the phase analysis circuit structures generate a phase correction signal having a value determined by a difference between the primary sampling point clock signal and the duplicate clock signal that is fed back to the high-speed phase mixer circuit. By utilizing this closed-loop clock alignment circuit to phase-align the primary data sampling clock signal to the optimal sample point phase, the present invention provides a CDR circuit having a smaller size (i.e., occupies a smaller chip area) and exhibits lower power consumption than that associated with conventional CDR circuits. That is, CDR phase shifting circuits are often implemented using a phase mixer. To design high-speed phase mixers, minimum device channel lengths and smaller widths are often used to avoid excessive loading, but these smaller device sizes conflict with the requirement of better matching the delays in the IX-CLK and I-CLK circuit paths. The closed-loop arrangement of the present invention facilitates the use of a high-speed phase mixer by producing less stringent matching requirements, and thus exhibits lower power consumption and has a smaller size than conventional open-loop approaches. Moreover, the closed-loop clock alignment approach implemented by the present invention exhibits improved phase alignment accuracy while lessening design requirements associated with conventional approaches. That is, if the primary sampling point clock signal were adjusted to match the duplicate clock signal using an open-loop approach, the required open-loop clock alignment circuit would introduce a phase offset (mismatch) between the primary and duplicate clock signals due to random device variations, which would reduce read accuracy in comparison to mid-interval sample point approaches.

According to a presently preferred embodiment the CDR circuit/method is configured to utilize the closed-loop clock alignment circuit during multiple phase-alignment processes during each data reception operation. For example, the closed-loop clock alignment circuit may be utilized to perform an initial phase-alignment process at the beginning of each data reception operation to quickly phase-align the primary data sampling clock signal to a designated (e.g., mid-interval) sampling point phase, and then subsequently re-used to perform one or more optimization phase-alignment processes utilized to re-align the primary data sampling clock signal each time an optimal sample point phases is identified. This approach optimizes overall data reception efficiency because, as mentioned above, the optimal sample point phase is identified using a duplicate clock (second) signal, whereby the primary data sampling clock signal aligned to the designated sampling point phase may be utilized until an optimal sample point phase is identified. Moreover, re-using the closed-loop clock alignment circuit in this manner further enhances the space-saving benefits associated with the present invention.

According to an exemplary embodiment the CDR circuit/method utilizes the closed-loop clock alignment circuit and an associated target clock signal to achieve phase-alignment of the primary sampling point clock signal during each phase-alignment processes. For example, during the initial phase-alignment process, the primary data sampling clock signal is aligned to the initial clock signal, which is provided to the closed-loop clock alignment circuit, and is produced by generating an associated edge clock signal based on the received data signal using known techniques and then changing the edge clock phase by 90°. The closed-loop clock alignment circuit then performs the initial phase-alignment process by generating a first phase value based on a difference between the primary sampling point clock signal and the edge clock signal, generating a second phase value based on a difference between the initial clock signal and the edge clock signal, generating an initial phase correction signal based on a difference between the first and second phase values, and then modifying the primary sampling point clock signal using the initial phase correction signal (e.g., by combining the primary sampling point clock signal and the initial phase correction signal in a high-speed phase mixer). Note that the modified primary sampling point clock signal is fed back to the closed-loop clock alignment circuit, so the modification process may be repeated multiple times until the primary data sampling clock signal is aligned to the initial clock signal (i.e., until the initial phase correction signal is zero). During the one or more subsequent optimization phase-alignment processes the duplicate clock signal is passed to the closed-loop clock alignment circuit, and the closed-loop clock alignment circuit is controlled to perform the same operations described above (i.e., with the duplicate clock signal being processed in place of the initial clock signal), whereby the primary data sampling clock signal is aligned to the duplicate clock signal.

In one embodiment the duplicate clock signal is utilized to identify the optimal sample point phase by copying or otherwise duplicating the primary sampling point clock signal (e.g., such that a phase of said duplicate clock signal is equal to the mid-interval sampling point phase), and then systematically adjusting the phase of the duplicate clock signal and generating associated bit error rate values, whereby the optimal sample point phase is identified by the phase that generates the lowest bit error rate value. The duplicate clock signal is then set to the identified optimal sample point phase, and then the above-mentioned optimization phase-alignment processes is performed to modify the primary sampling point clock signal.

In one embodiment the present invention is directed to a CDR module (e.g., a circuit or standard cell) that is operably implemented in a wireline transceiver module, which in turn is configured for incorporation into an integrated circuit IC device/design (e.g., by way of a host EDA tool) such that the transceiver module operably receives data signals from one or more upstream circuit module (circuit/cell) of the IC device/design and transmits corresponding data values to one or more downstream circuit modules of the IC device/design. In this context the transceiver module typically utilizes circuitry known in the art (herein generally referred to as a decision circuit for brevity) to process the received data signal in order to generate the corresponding data values by way of utilizing a primary sampling point clock signal to periodically sample the voltage level of each unit interval of the data signal. In accordance with the present invention, the CDR module includes clock generation circuitry, control circuitry and a closed-loop clock alignment circuit that are operably configured generate the primary sampling point clock signal used by the decision circuit. Operation of the clock generation circuitry is controlled by way of clock control signals transmitted from the control circuitry, and the clock generation circuitry utilizes circuitry/methods known in the art to generate an edge clock signal (i.e., to recover/reconstruct the transmission clock signal utilized during generation of the received data signal), to generate duplicate clock signal according to an identified optimal sample point phase, and to generate the primary sampling point clock signal based on alignment data received from the closed-loop clock alignment circuit. The clock generation circuitry is also configured to identified optimal sample point phase using techniques similar to those used by conventional CDR circuits, but differs from conventional approaches in that the clock generation circuitry of the present invention utilizes a duplicate (second) clock signal in the manner mentioned above. The edge clock signal, the initial clock signal, the duplicate clock signal and the primary sampling point clock signal generated by the clock generation circuitry are transmitted to the closed-loop clock alignment circuit. According to a presently preferred embodiment, the closed-loop clock alignment circuit includes a high-speed phase mixer circuit, a multiplexer (MUX), a phase detector circuit (e.g., a differential XOR circuit), a comparator circuit and a digital phase control circuit (e.g., a finite state machine (FSM)). The high-speed phase mixer circuit includes a first input terminal coupled to receive the initial (input) primary sampling point clock signal, a second input terminal coupled to receive feedback (phase correction) signals from the digital phase control circuit, and an output terminal connected to a first input terminal of the MUX. The MUX also includes a second input terminal operably coupled to receive the duplicate clock signal and an optional third input terminal operably coupled to receive the initial clock signal, and the MUX is controlled by way of MUX control signals transmitted from the control circuitry to pass a selected clock signal (i.e., one of the primary sampling point clock signal, the duplicate clock signal and the initial clock signal) to a first input terminal of the phase detector circuit. The phase detector circuit also has a second input terminal coupled to receive the edge clock signal and is configured to generate a phase detection signal based on a difference between the edge clock signal and the selected clock signal received from the MUX. In one embodiment the comparator circuit is an auto zero comparator including two storage elements that receive and store two phase detection signals generated by the phase detector circuit during two sequential phase detection operations and being configured to generate a comparison signal having a value determined by a phase difference between the pairs of stored phase detection signals. The digital phase control circuit is configured to generate the phase correction signal in response to the comparison signal received from the comparator circuit, with the phase correction signals being transmitted to the high-speed phase mixer circuit to provide a closed-loop configuration that facilitates accurately adjusting (moving) the phase of the primary sampling point clock signal with minimal offset. The closed-loop configuration also facilitates the efficient re-use of the high-speed phase mixer circuit, the phase detector circuit, the comparator circuit and the digital phase control circuit during the initial and optimization phases of each data reception process, whereby CDR circuits configured in accordance with the present invention reduce overall IC fabrication costs by way of requiring less power and a smaller amount of substrate (chip) area than that required by conventional CDR approaches.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to CDR methods and modules (i.e., standard cells or physical circuits), and to an EDA software tool configured to incorporate the CDR modules into IC (circuit) designs during their development. The figures and the following detailed description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The figures and detailed description may also signify, implicitly or explicitly, advantages and improvements of a subset of the exemplary embodiments described herein.

In the figures and detailed description, numerous specific details may be described to provide a thorough understanding of one or more of the exemplary embodiments. In the interest of not obscuring the presentation of embodiments of the claimed inventions, in the following detailed description, some processing steps or operations that are known in the art may have been combined together for presentation and for illustration purposes and in some instances may have not been described in detail. However, a person skilled in the art will recognize that these embodiments may be used in commerce without these specific details or with equivalents thereof. In other instances, well-known processes and devices are not described in detail as not to unnecessarily obscure aspects of these embodiments. In other instances, some processing steps or operations that are known in the art may not be described at all. The following description is instead focused on the distinctive features or elements of various embodiments of the claimed inventions. Furthermore, while this description may refer to some components of the structure in the singular tense, more than one component may be depicted throughout the figures and like components are labeled with like numerals.

Figure 1:
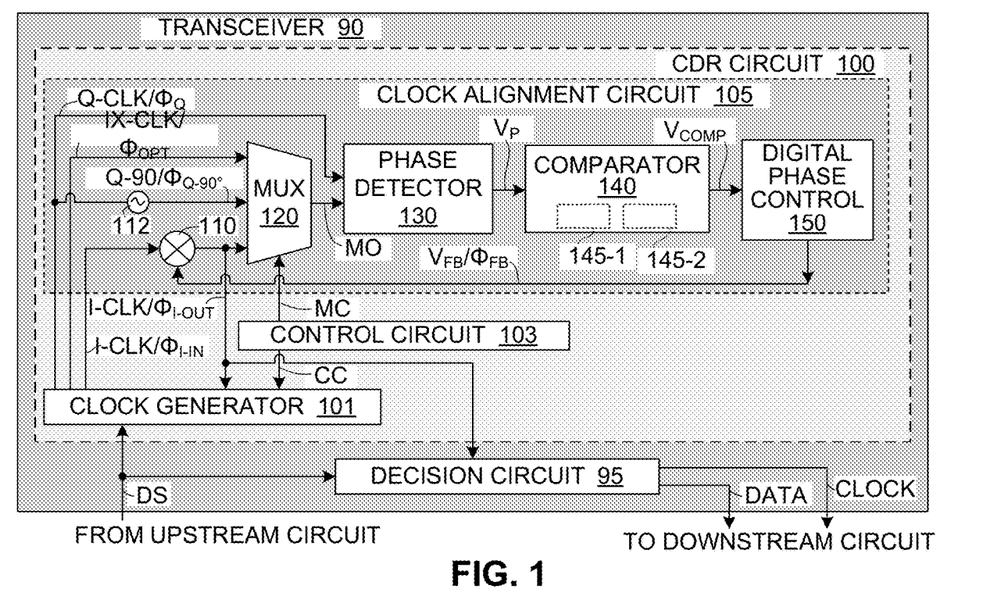
FIG. 1 is block diagram showing a CDR module (e.g., a circuit or standard cell) incorporated into a wireline transceiver in an IC device/design according to an embodiment of the present invention.

FIG. 1 shows a partial IC device including a greatly simplified wireline transceiver 90 implementing a CDR circuit (module) 100 configured in accordance with a generalized embodiment of the present invention. The depicted portion of transceiver 90 includes a decision circuit 95 configured to process a data signal DS received from an upstream circuit (not shown) of the IC device and to transmit corresponding data values DATA and an optional clock signal CLOCK to a downstream circuit block (not shown) of the IC device for further processing. Similar to conventional transceiver arrangements, the generation of corresponding data values DATA involves sampling voltage levels of each unit interval forming received data signal DS in accordance with a primary sampling point clock signal (primary clock) I-CLK, where primary clock signal I-CLK is generated by CDR circuit 100 as described herein. Other portions of transceiver circuit 90 are implemented using conventional techniques and are omitted for brevity.

Referring to the upper portion of FIG. 1, CDR module 100 generally includes clock generation circuitry 101, a control circuit 103 and a closed-loop clock alignment circuit 105.

Clock generation circuitry 101 is controlled by clock control signals CC generated by control circuitry 103, and utilizes circuitry/methods known in the art to generate an edge clock signal Q-CLK (i.e., to recover/reconstruct the transmission clock signal utilized during generation of received data signal DS), to generate a duplicate (second/secondary) clock signal IX-CLK according to an identified optimal sample point phase $\Phi_{OPT}$ using techniques described below, and to generate primary clock I-CLK based on alignment data received from closed-loop clock alignment circuit 105. Clock generation circuitry 101 includes phase rotator or other circuitry configured to identify optimal sample point phases $\Phi_{OPT}$ using techniques similar to those used by some conventional CDR circuits, but clock generation circuitry 101 differs from conventional circuits in it utilizes duplicate clock signal IX-CLK in the manner described in detail below. Edge clock signal Q-CLK, an optional initial clock signal Q-90, duplicate clock signal IX-CLK and the primary clock I-CLK are generated and transmitted to closed-loop clock alignment circuit 105 during associated operating phases described below in accordance with clock control signals CC.

In the exemplary embodiment shown in FIG. 1, closed-loop clock alignment circuit 105 includes a high-speed phase mixer circuit 110, a multiplexer (MUX) 120, a phase detector circuit 130, a comparator circuit 140 and a digital phase control circuit 150. High-speed phase mixer circuit 110 includes a first input terminal coupled to receive primary clock I-CLK having an initial (input) phase $\Phi_{I-IN}$, a second input terminal coupled to receive a feedback (phase correction) signal $V_{FB}$ from digital phase control circuit 150, and an output terminal connected to a first input terminal of MUX 120. MUX 120 also includes a second input terminal operably coupled to receive duplicate clock signal IX-CLK and an optional third input terminal operably coupled to receive an initial clock signal Q-90, which in one embodiment is generated by way of using a phase shifter 112 to shift edge clock signal Q-CLK by 90°. MUX 120 is controlled by way of MUX control signals MC generated by control circuitry 103 such that MUX 120 an output signal MO generated on its output terminal includes a selected clock signal (i.e., one of primary clock I-CLK, duplicate clock signal IX-CLK or initial clock signal Q-90), which is passed to a first input terminal of phase detector circuit 130. Phase detector circuit 130 also has a second input terminal coupled to receive edge clock signal Q-CLK and is configured to generate a phase detection signal $V_P$ based on a phase difference between edge clock signal Q-CLK and the selected clock signal received from MUX 120. Comparator circuit 140 comprises an auto zero comparator including two voltage storage elements 145-1 and 145-2 operably configured to receive and store two phase detection signals from phase detector circuit 130 during two sequential phase detection operations (described below), and is configured to generate a comparison signal $V_{COMP}$ having a value determined by a phase difference between each associated pair of phase detection signals stored in elements 145-1 and 145-2. Digital phase control circuit 150 is configured to generate a phase correction signal $V_{FB}$ in response to each comparison signal $V_{COMP}$ received from comparator circuit 140 such that each phase correction signal $V_{FB}$ includes a phase correction value $\Phi_{FB}$ that, when combined with primary clock I-CLK in high-speed phase mixer circuit 110, causes high-speed phase mixer circuit 110 to generate a modified version of primary clock I-CLK having a final (output) phase $\Phi_{I\text{-}OUT}$ in a way that aligns primary clock I-CLK with either duplicate clock signal IX-CLK or initial clock signal Q-90 in the manner described below.

Figure 2:
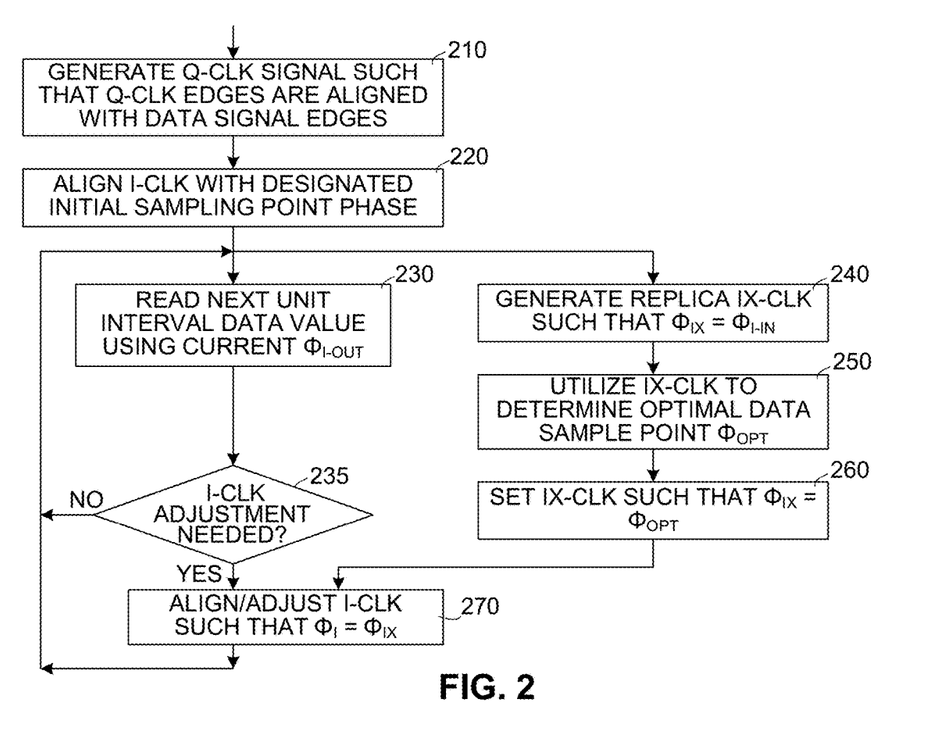
FIG. 2 is flow diagram depicting a CDR method according to another embodiment of the present invention.

FIG. 2 is flow diagram depicting a CDR method according to another embodiment of the invention. For clarity, the various steps associated with FIG. 2 are further described with reference to FIGS. 1, 3A to 3C, 4A to 4C and 5A to 5C. Note that the circuit arrangement of FIG. 1 represents one possible circuit arrangement for implementing the method of FIG. 2, so the specific embodiments described with reference to FIGS. 3A to 5C are considered exemplary; that is, the method of FIG. 2 is not limited to the structures and features of FIGS. 1 and 3A to 5C.

In one embodiment, during an initial portion of each data reception process (e.g., soon after a new data signal DS is detected), closed-loop clock alignment circuit 105 is utilized to align primary clock signal I-CLK with a pre-designated initial/default sampling point phase such that primary clock signal I-CLK is quickly made available to read data signal DS. In a specific embodiment, clock generator 101 generates edge clock signal Q-CLK with its edge clock phase $\Phi_Q$ aligned with the edges of data signal DS using known techniques (block 210, FIG. 2), then edge clock signal Q-CLK is utilized to generate an initial clock signal Q-90 with designated initial clock phase $\Phi_{Q\text{-}90}$ (e.g., by way of phase-shifter 112 shown in FIG. 1), and then closed-loop clock alignment circuit 105 is utilized to align sampling point phase $\Phi_{I\text{-}OUT}$ of primary clock signal I-CLK with designated initial clock phase $\Phi_{Q\text{-}90}$ of initial clock signal Q-90 (block 220, FIG. 2).

Figure 3A:
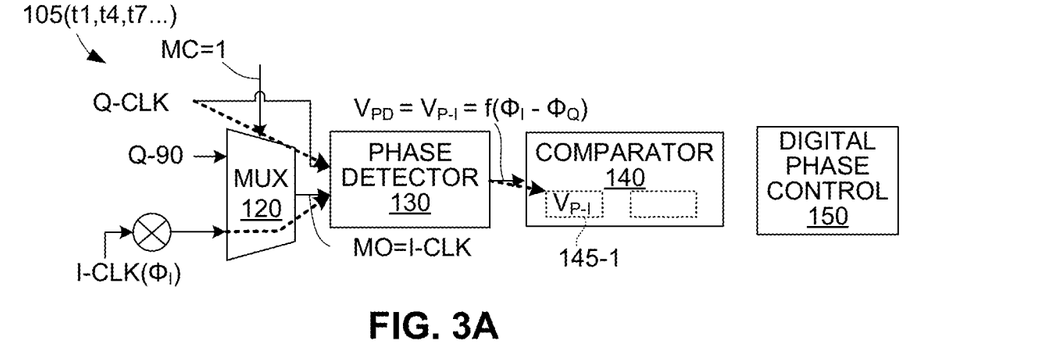
FIGS. 3A, 3B and 3C are circuit diagrams depicting operations performed by the closed-loop clock alignment circuit of FIG. 1 during an exemplary initial phase-alignment process performed in accordance with a specific embodiment of the present invention.
Figure 3B:
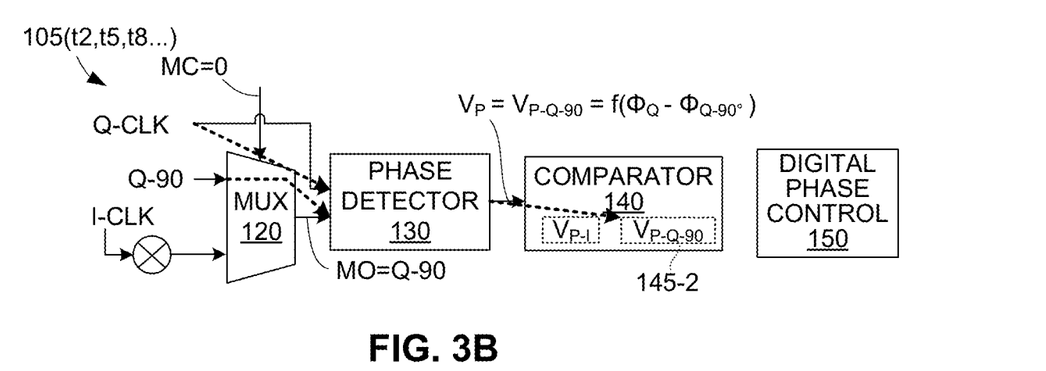
Figure 3C:
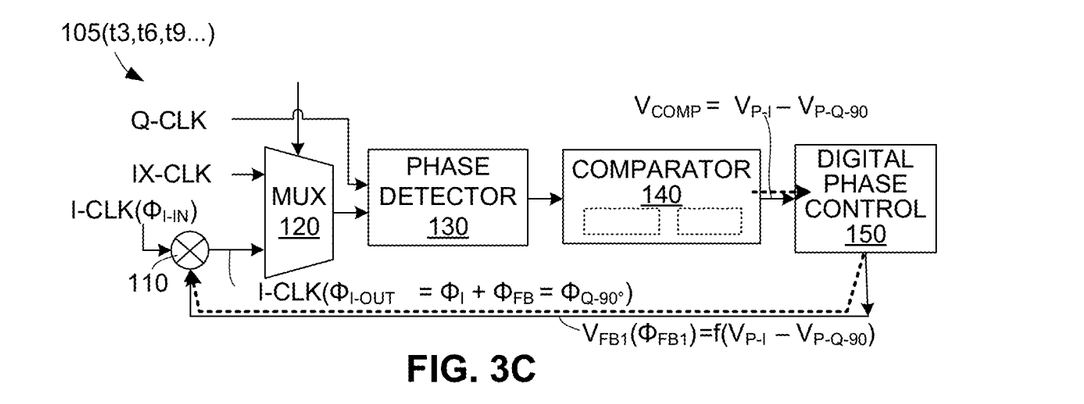

FIGS. 3A to 3C depict associated operating states of closed-loop clock alignment circuit 105 (FIG. 1) during corresponding phases of an exemplary initial phase alignment process used to align primary clock signal I-CLK with initial clock signal Q-90. As indicated by parenthetical time designations in each figure (e.g., "105(t1, t4, t7 . . ." in FIG. 3A), the operating states depicted in FIGS. 3A to 3C are cyclically repeated until primary clock signal I-CLK is fully aligned with initial clock signal Q-90. Referring to FIG. 3A, a first operation performed during a first time period t1 includes controlling MUX 120 to pass primary clock signal I-CLK to phase detector 130, whereby output value $V_P$ generated by phase detector 130 at time t1 has a first phase value $V_{P\text{-}I}$ determined by a phase difference between primary sampling point clock signal I-CLK and edge clock signal Q-CLK (i.e., a function based on a difference between sampling point phase $\Phi_I$ and edge clock phase $\Phi_Q$), and then first phase value $V_{P\text{-}I}$ is stored in voltage storage element 145-1 of comparator 140. Referring to FIG. 3B, a second operation performed during a second time period t2 includes controlling MUX 120 to pass initial clock signal Q-90 to phase detector 130, whereby output value $V_P$ generated by phase detector 130 at time t2 has a second phase value $V_{P\text{-}Q\text{-}90}$ determined by a phase difference between initial clock signal Q-90 and edge clock signal Q-CLK (i.e., a function based on the 90° difference between phases $\Phi_{Q\text{-}90}$ and $\Phi_Q$), and then second phase value $V_{P\text{-}Q\text{-}90}$ is stored in voltage storage element 145-2 of comparator 140. FIG. 3C depicts a third time period t3 during which comparator 140 generates comparator output signal value $V_{COMP}$ determined by a difference between phase values $V_{P\text{-}I}$ and $V_{P\text{-}Q\text{-}90}$, then digital phase control circuit 150 generates an associated initial phase correction signal $V_{FB1}$ (e.g., a voltage level corresponding to an associated correction phase $\Phi_{FB1}$) as a function of the phase value difference, whereby primary sampling point clock I-CLK is modified using initial phase correction signal $V_{FB1}$ (i.e., by way of combining initial phase correction signal $V_{FB1}$ and sampling point clock I-CLK in high-speed phase mixer 110). Three operations performed at times t1, t2 and t3, respectively, are then systematically repeated (e.g., the operation depicted in FIG. 3A is repeated at times t3, t7 . . . , and the operation depicted in FIG. 3B is repeated at times t2, t8 . . . ) until primary sampling point clock signal I-CLK is aligned with initial clock signal Q-90 (i.e., until initial phase correction signal $V_{FB1}$ indicates a zero or substantially zero correction phase $\Phi_{FB1}$).

Referring again to blocks 210 and 220 of FIG. 2, note that various alternative approaches may be utilized to generate primary clock signal I-CLK with a pre-designated initial clock phase. For example, primary clock signal I-CLK may be initially generated without utilizing closed-loop clock alignment circuit 105, although such alternative approaches would not take advantage of the various benefits discussed herein. As further examples, various alternative techniques may be utilized to generate initial clock signal Q-90 (e.g., initial clock signal Q-90 may be generated entirely within clock generator 101), and the pre-designated initial/default sampling point phase may differ from the 90° mid-interval phase utilized in the examples (e.g., the pre-designated initial/default sampling point phase may differ from edge clock phase $\Phi_Q$ by 95°).

As indicated by blocks 230 and 235 of FIG. 2, primary clock I-CLK is maintained in alignment with the currently designated sampling point phase during subsequent portions of the data reception process until an optimal sample point phase is identified. That is, each unit data interval of the sequence of data unit intervals forming received data signal DS is read using a current primary clock I-CLK (block 230, FIG. 2), whereby one or more unit data intervals occurring early in the sequence are read using initial clock phase $\Phi_{Q\text{-}90°}$ (e.g., the mid-interval phase mentioned above), and then control passes to decision block 235. Before an optimal sample point phase is identified (as described below), decision block 235 passes control along its NO branch back to block 230, whereby one or more additional unit data intervals in the sequence are read using initial clock phase $\Phi_{Q\text{-}90°}$ (i.e., sampling point phase $\Phi_{I\text{-}OUT}$ of current primary clock I-CLK remains unchanged).

As mentioned above, duplicate (second) clock signal IX-CLK is utilized to identify an optimal sample point phase $\Phi_{OPT}$ while data values DATA are generated using primary sampling point clock signal I-CLK. Concurrent performance of the optimal sample point phase identification process and the data read process is indicated in FIG. 2 by blocks 240 and 250 (FIG. 2), which are disposed in parallel with blocks 230 and 235. In one embodiment duplicate clock signal IX-CLK is utilized to identify an optimal sample point phase $\Phi_{OPT}$ by copying or otherwise duplicating primary sampling point clock signal I-CLK (e.g., such that a phase of duplicate clock signal IX-CLK is equal to mid-interval sampling point phase $\Phi_{Q-90°}$; see block 240, FIG. 2), and then systematically adjusting the phase of duplicate clock signal IX-CLK and generating associated bit error rate values, whereby optimal sample point phase $\Phi_{OPT}$ is identified by the adjusted phase that duplicate clock signal IX-CLK to generate a lowest bit error rate value (FIG. 2 block 250; see also FIG. 4B, described below). Duplicate clock signal IX-CLK is then aligned with identified optimal sample point phase $\Phi_{OPT}$ (block 260, FIG. 2), and then an optimization phase-alignment processes (described below) is performed using closed-loop clock alignment circuit 105 to re-align primary sampling point clock signal I-CLK with duplicate clock signal IX-CLK (e.g., the sampling point phase of primary sampling point clock signal I-CLK is modified from mid-interval sampling point phase $\Phi_{Q-90°}$ to optimal sample point phase $\Phi_{OPT}$).

Figure 4A:
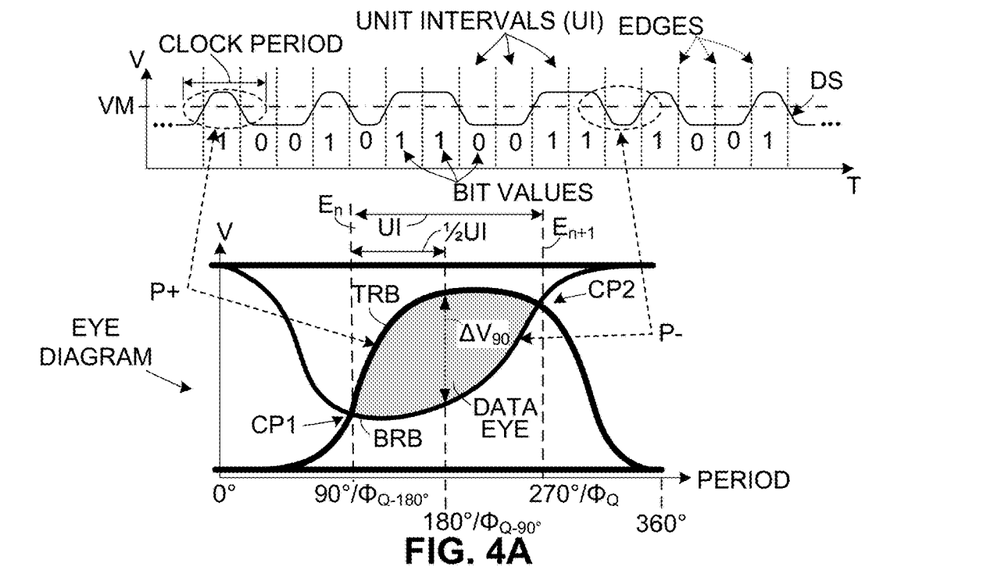
FIGS. 4A, 4B and 4C are exemplary eye diagrams respectively depicting the identification of an optimal sample point phase performed in accordance with a specific embodiment of the present invention.
Figure 4B:
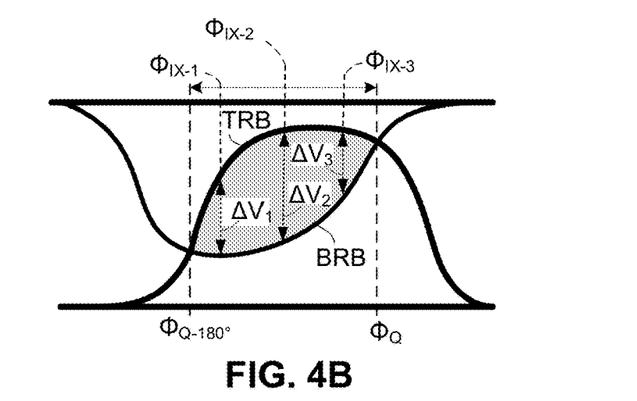
Figure 4C:
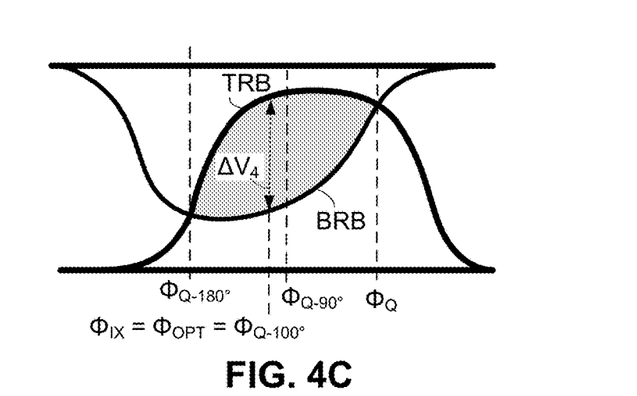

FIGS. 4A, 4B and 4C show how a data signal DS may be represented by an exemplary eye diagram, and generally describe an optimal sample point identification process implemented by clock generator 101 using known techniques (see, e.g., Ozkaya et al., "A 60-Gb/s 1.9-pJ/bit NRZ Optical Receiver with Low-Latency Digital CDR in 14-nm CMOS FinFET", cited above). FIG. 4A shows that exemplary (and greatly shortened) data signal DS includes a message-specific series of periodically spaced voltage levels that indicate either a binary "0" value (e.g., by way of a relatively low voltage level) or a binary "1" (e.g., by way of a relatively high voltage level). Data signal DS is generated by a source circuit block (not shown) using a localized reference clock signal such that each clock period includes two periodically spaced binary bit values, and each periodically spaced binary bit value occurs within an associated time period commonly referred to as a unit interval (UI) bounded by two associated transition edges. As indicated below data signal DS in FIG. 4A, an eye diagram includes a representative set of clock periods in which corresponding unit intervals are centered and superimposed, whereby 1-0-1 data transitions P− form U− shaped signal traces and 0-1-0 data transitions P+ form upside-down-U-shaped signal traces. The indicated overlap region DATA EYE is defined between a top region boundary TRB formed by a portion of the P+ transition trace and a bottom region boundary portion BRB formed by the P− transition trace. The two points at which the P− and P+ transition traces intersect represent clock edges $E_n$ and $E_{n+1}$ of data signal DS, which in this case occur at the 90°/$\Phi_{Q-180°}$ and 270°/Q phases of each clock cycle. FIG. 4A also depicts mid-interval clock phase $\Phi_{Q-90°}$, which occurs at the one-half-UI (180°) phase of each clock cycle, and indicates by vertical arrow $\Delta V_{90}$ that mid-interval clock phase $\Phi_{Q-90°}$ provides a relatively good point at which to sample data values because of the relatively large difference between top region boundary TRB and bottom region boundary BRB at this point. Accordingly, utilizing mid-interval clock phase $\Phi_{Q-90°}$ as the initial sampling point phase utilized during the early phase of each data reception process typically provides reasonably good data read accuracy. However, distortions associated with the generation of overlap region DATA EYE may provide optimal sampling points located away from mid-interval clock phase $\Phi_{Q-90°}$. As indicated in FIG. 4B, to determine whether such an optimal sampling point phase is present, duplicate clock signal IX-CLK is swept over the entire unit interval range, and data read operations are evaluated using the various different phases (e.g., phases $\Phi_{IX-1}$, $\Phi_{IX-2}$ and $\Phi_{IX-3}$) to identify a phase at which duplicate clock signal IX-CLK produces a better bit-error-rate than that generated using mid-interval clock phase $\Phi_{Q-90°}$. As indicated, phases $\Phi_{IX-1}$ and $\Phi_{IX-3}$ correspond to locations of overlap region DATA EYE having relatively small vertical differences between boundaries TRB and BRB (as indicated by vertical arrows $\Delta_{V4}$ and $\Delta_{V3}$) relative to the more centrally located phase $\Phi_{IX-2}$ (as indicated by relatively long vertical arrow $\Delta_{V2}$), which is typically indicated by a higher bit-error-rate value for phases $\Phi_{IX-4}$ and $\Phi_{IX-3}$ than for phase $\Phi_{IX-2}$. As indicated in FIG. 4C, an optimal sampling point phase $\Phi_{OPT}$ typically coincides with a phase within overlap region DATA EYE at which the vertical difference between boundaries TRB and BRB is maximized, which in the example is indicated by vertical arrow $\Delta_{V4}$ located at phase $\Phi_{Q-100°}$.

Referring to block 260 of FIG. 2, whenever an optimal sampling point phase $\Phi_{OPT}$ is identified, duplicate clock signal IX-CLK is set to the optimal sampling point phase $\Phi_{OPT}$, and decision block 235 is notified that an optimization phase-alignment process is required. During the next instance in which control is passed from block 230 to decision block 235, control passes along the YES branch from block 235 to block 270, whereby closed-loop clock alignment circuit 105 is again utilized, this time to align (adjust) sampling point phase $\Phi_I$ of primary data sampling clock signal I-CLK to optimal sampling point phase $\Phi_{OPT}$ by way of aligning primary data sampling clock signal I-CLK with duplicate clock signal IX-CLK.

Figure 5A:
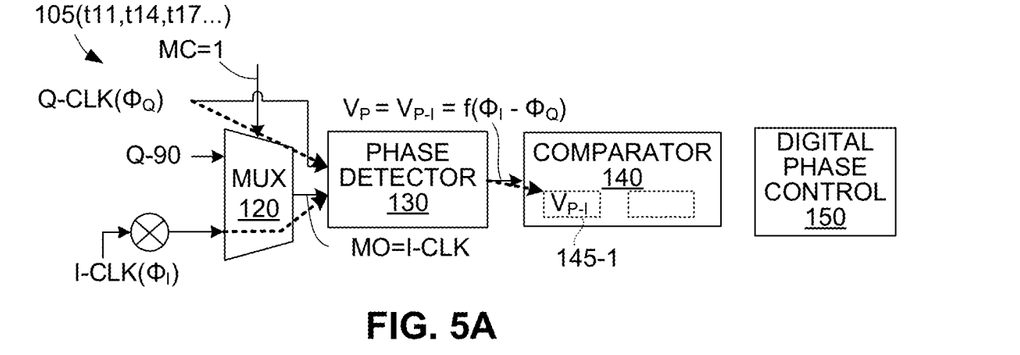
FIGS. 5A, 5B and 5C are circuit diagrams depicting operations performed by the closed-loop clock alignment circuit of FIG. 1 during an exemplary optimization phase-alignment process performed in accordance with a specific embodiment of the present invention.
Figure 5B:
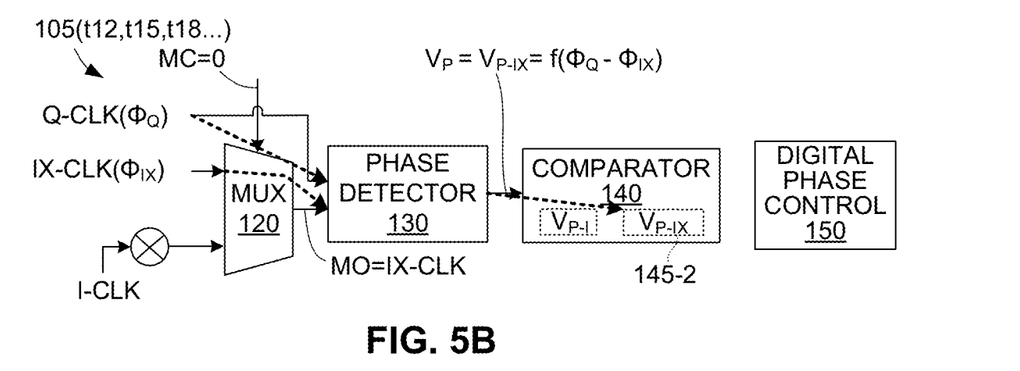
Figure 5C:
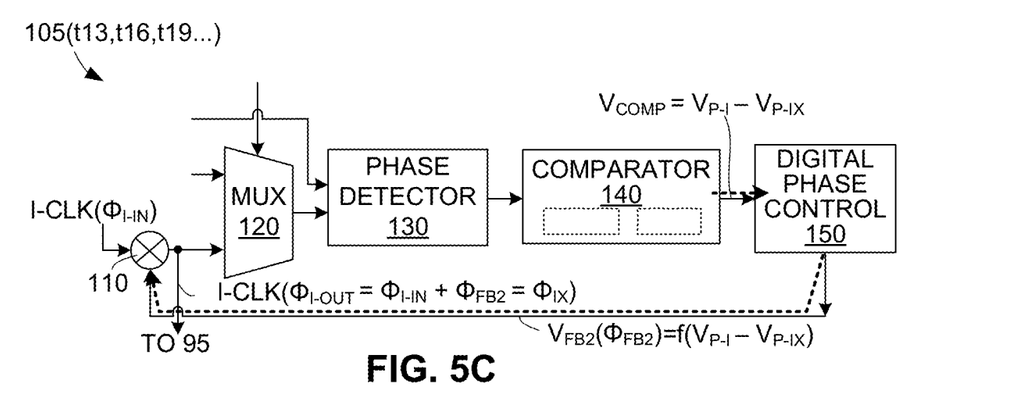

FIGS. 5A to 5C depict an exemplary optimization phase-alignment process using closed-loop clock alignment circuit 105, which is similar to the initial phase-alignment process described above with reference to FIGS. 3A to 3C. Parenthetical timing designations similar to those utilized in FIGS. 3A to 3C are utilized in FIGS. 5A to 5C. Referring to FIG. 5A, a (fourth) operation performed during time period t11 includes controlling MUX 120 to pass primary clock signal I-CLK to phase detector 130, whereby output value $V_P$ generated by phase detector 130 at time t11 has a (third) phase value $V_{P-I}$ determined by a phase difference between primary sampling point clock signal I-CLK and edge clock signal Q-CLK, and then phase value $V_{P-I}$ is stored in element 145-1 of comparator 140. Referring to FIG. 5B, a (fifth) operation performed during a second time period t12 includes controlling MUX 120 to pass duplicate clock signal IX-CLK to phase detector 130, whereby output value $V_P$ generated by phase detector 130 at time t12 has a (fourth) phase value $V_{P-IX}$, and then phase value $V_{P-IX}$ is stored in element 145-2 of comparator 140. FIG. 5C depicts a (sixth) time period t13 during which comparator 140 generates comparator output signal value $V_{COMP}$ determined by a difference between phase values $V_{P-I}$ and $V_{P-IX}$, then digital phase control circuit 150 generates an associated initial phase correction signal $V_{FB2}$ (e.g., a voltage level corresponding to an associated correction phase $\Phi_{FB2}$) as a function of the phase value difference, whereby primary sampling point clock I-CLK is modified using phase correction signal $V_{FB2}$ (i.e., by way of combining initial phase correction signal $V_{FB2}$ and sampling point clock I-CLK in high-speed phase mixer 110). Three operations performed at times t11, t12 and t13, respectively, are then systematically repeated (e.g., the operation depicted in FIG. 5A is repeated at times t13, t17 . . . ) until primary sampling point clock signal I-CLK is aligned with duplicate clock signal IX-CLK (i.e., until initial phase correction signal $V_{FB2}$ indicates a zero or substantially zero correction phase $\Phi_{FB2}$).

Figure 6:
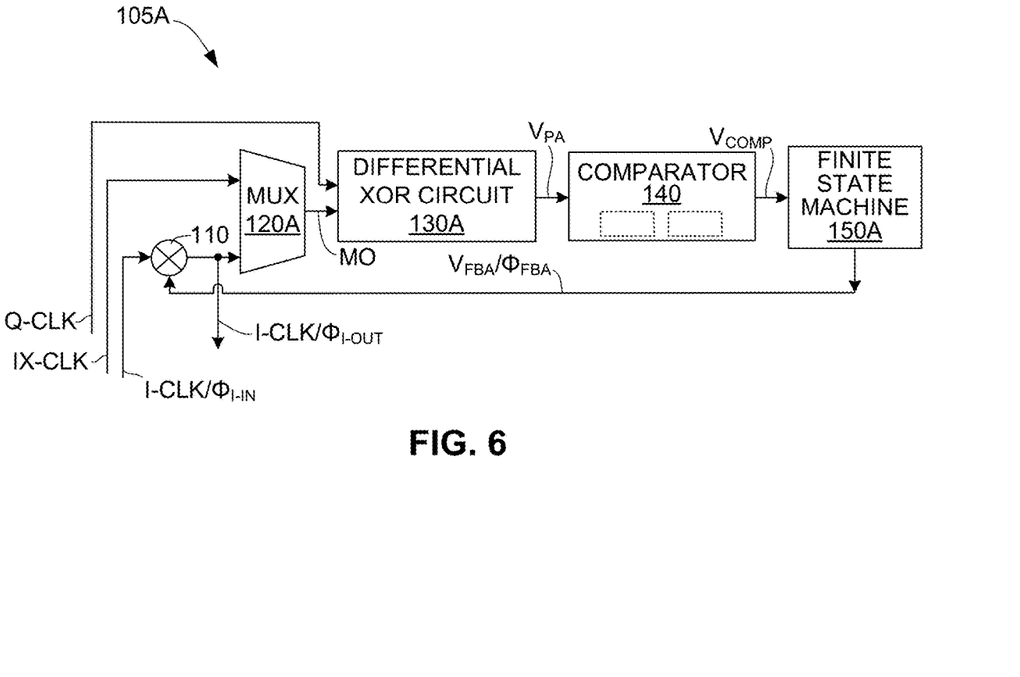
FIG. 6 is a block diagram depicting a closed-loop clock alignment circuit according to another exemplary embodiment.
Figure 7:
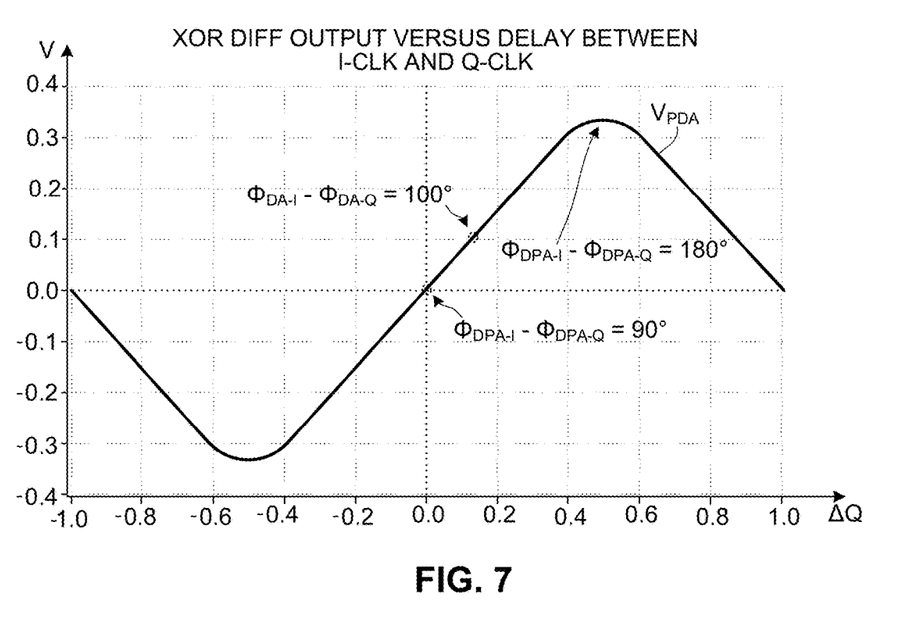
FIG. 7 is diagram depicting characteristic output voltages generated by a differential XOR circuit utilized in the closed-loop clock alignment circuit of FIG. 6.

FIG. 6 is a simplified block diagram depicting a closed-loop clock alignment circuit 105A according to an alternative exemplary embodiment. Circuit structures of closed-loop clock alignment circuit 105A that are substantially identical to those described above with reference to FIG. 1 are indicated using the same reference number in FIG. 6 and will not be discussed in detail below. Circuit structures of closed-loop clock alignment circuit 105A that represent specific implementations of corresponding generalized circuits described above with reference to FIG. 1 are indicated by the suffix "A" (e.g., MUX 120A is a two input multiplexer in closed-loop clock alignment circuit 105A). A main difference of closed-loop clock alignment circuit 105A relative to the embodiment described above with reference to FIG. 1 is that the phase detector circuit is implemented using a differential XOR circuit 130A that generates an output voltage $V_{P4}$ according to the graph shown in FIG. 7, whereby a voltage level of output voltage $V_{P4}$ indicates a phase difference between edge clock signal Q-CLK and the clock signal passed on multiplexer output terminal MO (i.e., either duplicate clock signal IX-CLK or primary clock signal I-CLK). Another difference of closed-loop clock alignment circuit 105A relative to the embodiment described above with reference to FIG. 1 is that a digital controller is implemented by a finite state machine 150A, which is configured using skills known in the art.

Technology Specific EDA System/Workflow Explanation

Figure 8:
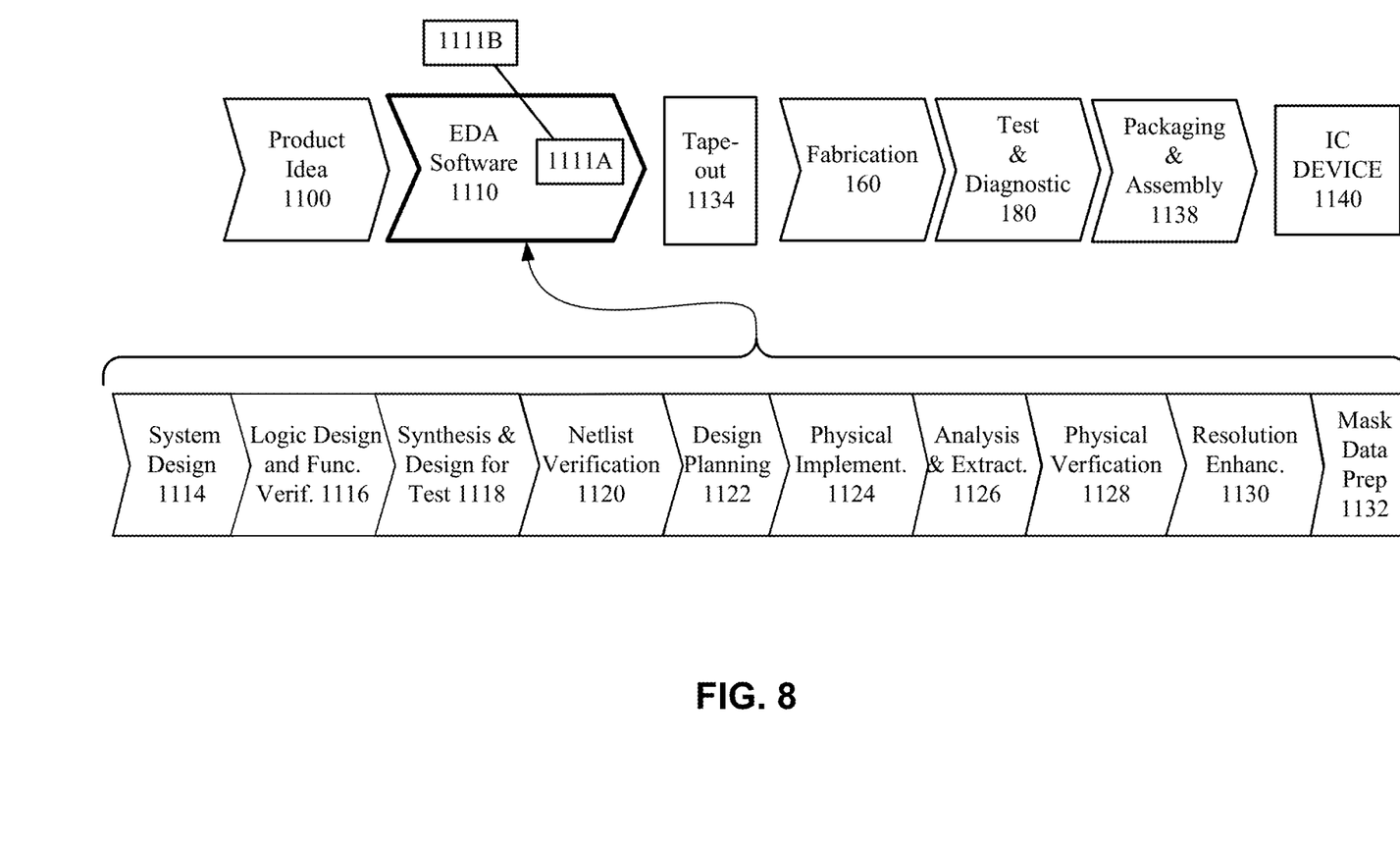
FIG. 8 is a flowchart illustrating various operations in the design and fabrication of an integrated circuit in accordance with an embodiment of the present disclosure.

FIG. 8 illustrates various processes performed in the design and fabrication of IC devices using EDA software tools with a computer to transform data and instructions that represent the associated IC devices. These processes start with the generation of a product idea (1100) with information supplied by one or more circuit designers. The product idea is realized as the evolving circuit design during the circuit design process performed by the circuit designer(s) using EDA software tools (1110). One or more steps of the EDA software design process performed by EDA software tools (1110) is implemented using a computer-readable medium 1111A that is read by a computer 1111B. EDA software tools may also be signified herein using the singular "EDA software tool", as EDA software, or as a design tool. When a circuit design is finalized, it is typically taped-out (1134), and then multiple ICs, each being a physical implementation of the final circuit design, are fabricated on a semiconductor wafer (1135) using a selected technology node, and then subjected to test and diagnosis (1136). The semiconductor wafer is then diced into individual chips, with each chip including one of the ICs, and then the chips are packaged and assembled using corresponding processes (1138), resulting in finished IC devices 1140.

Note that the design process that uses EDA software tools (1110) includes operations 1114-1132, which are described below. This design flow description is for illustration purposes only and is not meant to limit the present disclosure. For example, an actual circuit design may require a circuit designer to perform the design operations in a different sequence than the sequence described herein.

During system design (1114), a circuit designer describes the functionality to be performed by the manufactured IC device. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products. In one embodiment, one or more standard cells or other descriptions including all relevant information pertaining to the CDR circuits described herein are instantiated into a circuit design during the system design process (e.g., by way of copying the cell/description from a cell library accessible by way of the EDA software tool, and operably inserted into a selected location of a target circuit design).

Then, during logic design and functional verification (1116), VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products. In one embodiment, one or more standard cells describing the CDR circuit of the present invention may be copied from a cell library and instantiated into a given circuit design by a user/designer during logic design and functional verification.

Next, during synthesis and design for test (1118), VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification (1120), the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning (1122), an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation (1124), the placement (positioning of circuit elements such as transistors or capacitors) and routing (connection of the same by a plurality of conductors) occurs. Exemplary EDA software products from Synopsys, Inc. of Mountain View, Calif. that can be used at this stage include: the Astro and IC Compiler products.

Then, during analysis and extraction (1126), the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification (1128), the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement (1130), geometric manipulations of the layout are performed to improve manufacturability of the design. Exemplary EDA software products from Synopsys, Inc. of Mountain View, Calif. that can be used at this stage include: *Proteus, Proteus*, and PSMGED products.

Additionally, during mask-data preparation (1132), the 'tape-out' data for production of masks to produce finished integrated circuits is provided. Exemplary EDA software products from Synopsys, Inc. of Mountain View, Calif. that can be used at this stage include the Cats. family of products.

For all of the above-mentioned integrated circuit design tools, similar tools from other EDA vendors, such as Cadence and Mentor Graphics can be used as an alternative. Additionally, similarly non-commercial tools available from universities can be used.

Embodiments of the present disclosure can be used during one or more of the above-described stages. Specifically, some embodiments of the present disclosure can be used in EDA software 1110.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Hardware/Software Equivalence

Certain innovations, embodiments and/or examples described herein comprise and/or use a processor. As used herein, the term "processor" signifies a tangible information processing device that physically transforms information, for example, data. As defined herein, "data" signifies information that can be in the form of an electrical, magnetic, or optical signal that is capable of being stored, accessed, transferred, combined, compared, or otherwise manipulated by an information processing device.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For information structured in binary form, any processor that can transform the information using the AND, OR and NOT logical operations (and their derivatives, such as the NAND, NOR, and XOR operations) can transform the information using any function of Boolean logic. A processor such as a neural network processor can also transform information non-digitally. There is no scientific evidence that any of these processors are processing, storing and retrieving information, in any manner or form equivalent to the bioelectric circuitry of the human brain.

As used herein, the term "module" signifies a tangible information processing device that typically is limited in size and/or complexity. For example, one or more methods or procedures in a computer program can be referred to as a module. A module can also refer to a small network of digital logic devices, in which the logic devices often may be interconnected to form a network. In many cases, methods and procedures in a computer program written in a specialized language, such as System C, can be used to generate a network of digital logic devices that process information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Altera), Random Access Memories (RAMS) or microprocessors. A module is configured to process information, typically using a sequence of operations to transform the information (or in the case of ROMs and RAMS, transforming information by using the input information as an address for memory that stores output information), to perform aspects of the present innovations, embodiments and/or examples of the invention.

Modules that are temporarily configured need not be configured at any one instance in time. For example, an information processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a sequence or set of operations or instructions that a module can use to transform information to achieve a result. A module can comprise one or more algorithms. As used herein, the term "computer" includes an information processor that can perform certain operations such as (but not limited to) the AND, OR and NOT logical operations, with the addition of memory (for example, memory based on flip-flops using the NOT-AND or NOT-OR operation). Such a digital computer is said to be Turing-complete or computationally universal. A computer, whether or not it is a digital computer, typically comprises many modules.

As used herein, the term "software" or "program" signifies one or more algorithms and data structures that configure an information processing device for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of instruction and data that configure the information processing device to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from an information storage device. The computer typically has a device for reading storage media that is used to transport the software, or has an interface device that receives the software over a network.

Technology Specific General Computer Explanation

Figure 9A:
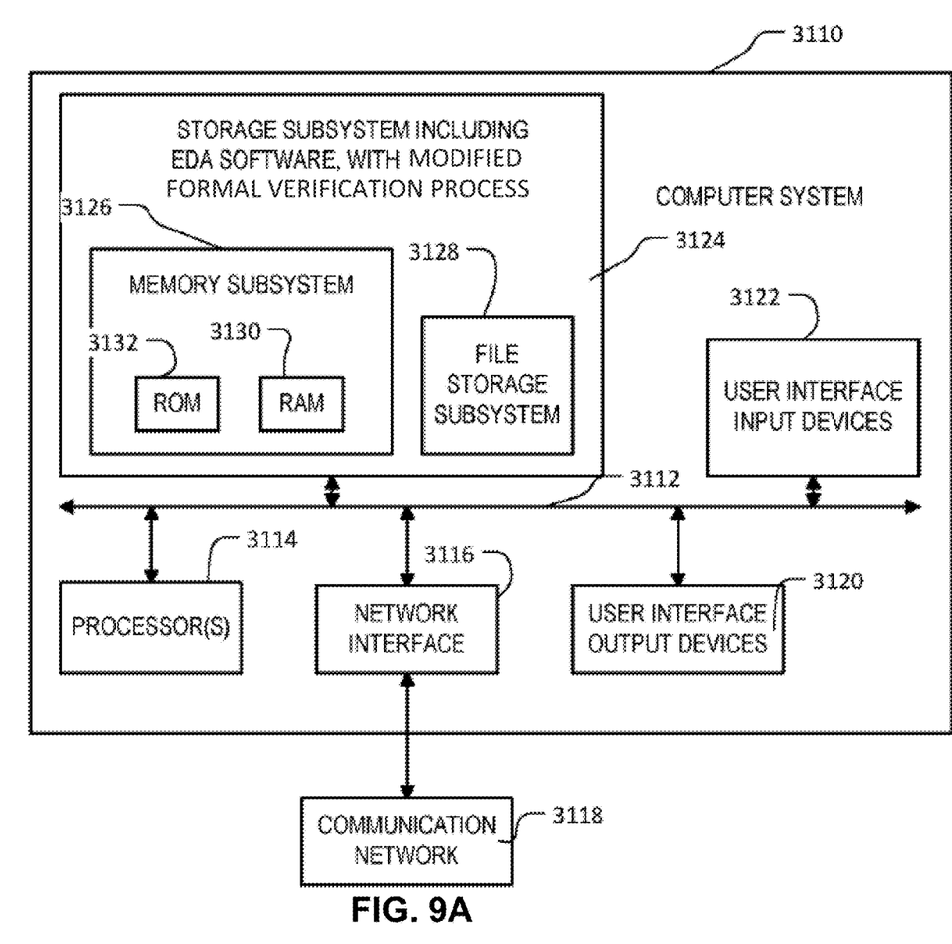
FIGS. 9A, 9B and 9C are simplified block diagrams of a computer system suitable for use with embodiments of the technology, as well as circuit design and circuit embodiments of the technology.
Figure 9B:
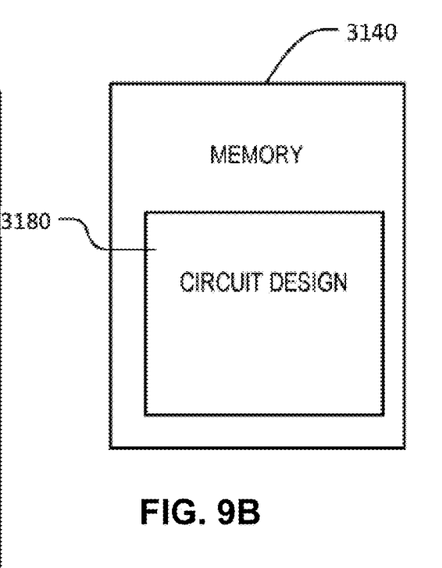
Figure 9C:
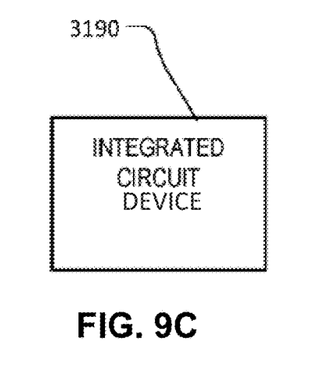

FIGS. 9A, 9B and 9C are simplified block diagrams of a computer system suitable for implementing an EDA tool (e.g., tool 1110 of FIG. 8) capable of generating and verifying circuit designs that include CDR circuits configured in accordance with the present invention. Computer system 3110 typically includes at least one computer or processor 3114 which communicates with a number of peripheral devices via bus subsystem 3112. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a television, a network router, switch or bridge, or any data processing machine capable of executing instructions (sequential or otherwise) that specify actions to be taken by that machine. Innovations, embodiments and/or examples of the claimed inventions are neither limited to conventional computer applications nor the programmable apparatus that run them. To illustrate, the innovations, embodiments and/or examples of the claimed inventions can include an optical computer, quantum computer, analog computer, or the like. Aspects of the present invention are well suited to multi-processor or multi-core systems and may use or be implemented in distributed or remote systems. Processor here is used in the broadest sense to include singular processors and multi-core or multi-processor arrays, including graphic processing units, digital signal processors, digital processors and combinations of these elements. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 3110 depicted in FIG. 9A is intended only as a specific example for purposes of illustrating the preferred embodiments. Many other configurations of computer system 3110 are possible having more or less components than the computer system depicted in FIG. 9A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example the Internet.

User interface input devices 3122 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3110 or onto communication network 3118. User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide nonvisual display such as via audio output devices. In general, use of the term "output device" is intended to include all possible types of devices and ways to output information from computer system 3110 to the user or to another machine or computer system.

Memory subsystem 3126 typically includes a number of memories including a main random-access memory (RAM) 3130 for storage of instructions and data during program execution and a read only memory (ROM) 3132 in which fixed instructions are stored. In one embodiment, RAM 3130 also serves to store standard cell libraries and other data utilized during instantiation of CDR modules of the present invention into circuit designs. File storage subsystem 3128 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 3128. Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses.

When configured to execute an EDA software tool configured to instantiate a CDR module of the present invention into a circuit design, computer system 3110 depicted in FIG. 9A represents an electronic structure suitable for creating a circuit design. FIG. 9B shows a memory 3140 such as a non-transitory, computer readable data storage medium associated with file storage subsystem 3128, and/or with network interface subsystem 3116, and includes a data structure 3180 specifying a circuit design describing an integrated circuit. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light). FIG. 9C is a block representing an IC 3190 designed and fabricated in accordance with the processes described above, where circuit 3190 is fabricated in accordance with the circuit design of data structure 3180 (see FIG. 9B).

The foregoing Detailed Description signifies in isolation individual features, structures or characteristics described herein and any combination of two or more such features, structures or characteristics, to the extent that such features, structures or characteristics or combinations thereof are based on the present specification as a whole in light of the knowledge of a person skilled in the art, irrespective of whether such features, structures or characteristics, or combinations thereof, solve any problems disclosed herein, and without limitation to the scope of the claims. When an embodiment of a claimed invention comprises a particular feature, structure, or characteristic, it is within the knowledge of a person skilled in the art to use such feature, structure, or characteristic in connection with other embodiments whether or not explicitly described.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims, and the claim scope is also intended to cover features that might not be specifically disclosed in the examples. For example, although the invention is described with specific reference to single data signals and associated clocks, those skilled understand that differential data signals/clocks are utilized in practical applications, and that the features and aspects described herein with reference to single data signals/clocks can be applied to differential data signals/clocks.

The invention claimed is:

1. A clock and data recovery (CDR) method implemented by a transceiver in an integrated circuit, the transceiver including a decision circuit configured to process a data signal received from an upstream circuit of the integrated circuit and to transmit corresponding data values to a downstream circuit of the integrated circuit, wherein generating said corresponding data values involves sampling said data signal in accordance with a primary sampling point clock signal, wherein said CDR method comprises:
   utilizing a second clock signal to identify an optimal sample point phase while generating said corresponding data values using said primary sampling point clock signal;
   setting said second clock signal in accordance with said identified optimal sample point phase; and
   utilizing a closed-loop clock alignment circuit to align said primary sampling point clock signal with said second clock signal,
   wherein utilizing said closed-loop clock alignment circuit comprises:
   using one or more circuit structures to generate a phase correction signal having a value determined by a difference between the primary sampling point clock signal and the second clock signal; and
   utilizing a high-speed phase mixer to modify the primary sampling point clock signal by combining the primary sampling point clock signal with said phase correction signal,
   wherein the high-speed phase mixer and said one or more circuit structures are configured such that the modified said primary sampling point clock signal output from said high-speed mixer is transmitted to said one or more circuit structures.

2. The CDR method of claim 1, further comprising:
   utilizing said closed-loop clock alignment circuit to align a sampling point phase of said primary sampling point clock signal with a designated initial sampling point phase; and
   maintaining the alignment of the sampling point phase of said primary sampling point clock signal with said designated initial sampling point phase until said setting of said second clock signal in accordance with said identified optimal sample point phase.

3. The CDR method of claim 2, wherein aligning the sampling point phase of said primary sampling point clock signal with said initial clock signal comprises:
   performing a first operation including generating a first phase value based on a difference between the primary sampling point clock signal and said edge clock signal;
   performing a second operation including generating a second phase value based on a difference between the initial clock signal and said edge clock signal;
   performing a third operation including generating an initial phase correction signal based on a difference between the first and second phase values, and then modifying the primary sampling point clock signal using the initial phase correction signal; and
   repeating the first, second and third operations until the sampling point phase of the primary sampling point clock signal is aligned with the initial clock signal.

4. The CDR method of claim 2, wherein utilizing the phase correction signal to modify the primary sampling point clock signal comprises utilizing a high-speed mixer to combine the primary sampling point clock signal with said phase correction signal.

5. The CDR method of claim 2, wherein utilizing said closed-loop clock alignment circuit to align said primary sampling point clock signal with said second clock signal comprises:
   performing a fourth operation including generating a third phase value based on a difference between the primary sampling point clock signal and said edge clock signal;

performing a fifth operation including generating a fourth phase value based on a difference between the second clock signal and said edge clock signal;

performing a sixth operation including generating a second phase correction signal based on a difference between the third and fourth phase values, and then modifying the primary sampling point clock signal using the second phase correction signal; and repeating the fourth, fifth and sixth operations until the primary sampling point clock signal is aligned with the second clock signal.

6. A clock and data recovery (CDR) method implemented by a transceiver in an integrated circuit, the transceiver including a decision circuit configured to process a data signal received from an upstream circuit of the integrated circuit and to transmit corresponding data values to a downstream circuit of the integrated circuit, wherein generating said corresponding data values involves sampling said data signal in accordance with a primary sampling point clock signal, wherein said CDR method comprises:

utilizing a closed-loop clock alignment circuit to align said primary sampling point clock signal with a designated initial sampling point phase;

maintaining the alignment of said primary sampling point clock signal with said designated initial sampling point phase and generating said corresponding data values using said primary sampling point clock signal while utilizing a second clock signal to identify an optimal sample point phase;

setting said second clock signal in accordance with said identified optimal sample point phase; and utilizing said closed-loop clock alignment circuit to align said primary sampling point clock signal with said second clock signal.

7. The CDR method of claim 6, wherein aligning said primary sampling point clock signal with said designated initial sampling point phase comprises:

generating an edge clock signal such that an edge clock phase of said edge clock signal is aligned with corresponding transition edges of said data signal;

generating an initial clock signal such that an initial clock phase of said initial clock signal is 90° out of phase with said edge clock phase of said edge clock signal; and utilizing said closed-loop clock alignment circuit to align said primary sampling point clock signal with said initial clock signal.

8. The CDR method of claim 7, wherein aligning said primary sampling point clock signal with said initial clock signal comprises:

performing a first operation including generating a first phase value based on a difference between the primary sampling point clock signal and said edge clock signal;

performing a second operation including generating a second phase value based on a difference between the initial clock signal and said edge clock signal;

performing a third operation including generating an initial phase correction signal based on a difference between the first and second phase values, and then modifying the primary sampling point clock signal using the initial phase correction signal; and repeating the first, second and third operations until the primary sampling point clock signal is aligned with the initial clock signal.

9. The CDR method of claim 8, wherein utilizing the phase correction signal to modify the primary sampling point clock signal comprises utilizing a high-speed mixer to combine the primary sampling point clock signal with said phase correction signal.

10. The CDR method of claim 8, wherein utilizing said closed-loop clock alignment circuit to align said primary sampling point clock signal with said second clock signal comprises:

performing a fourth operation including generating a third phase value based on a difference between the primary sampling point clock signal and said edge clock signal;

performing a fifth operation including generating a fourth phase value based on a difference between the second clock signal and said edge clock signal;

performing a sixth operation including generating a second phase correction signal based on a difference between the third and fourth phase values, and then modifying the primary sampling point clock signal using the second phase correction signal; and repeating the fourth, fifth and sixth operations until the primary sampling point clock signal is aligned with the second clock signal.

11. A clock and data recovery (CDR) method implemented by a transceiver in an integrated circuit, the transceiver including a decision circuit configured to process a data signal received from an upstream circuit of the integrated circuit and to transmit corresponding data values to a downstream circuit of the integrated circuit, wherein generating said corresponding data values involves sampling said data signal in accordance with a primary sampling point clock signal, wherein said CDR method comprises:

utilizing a second clock signal to identify an optimal sample point phase while generating said corresponding data values using said primary sampling point clock signal;

setting said second clock signal in accordance with said identified optimal sample point phase; and utilizing a closed-loop clock alignment circuit to align said primary sampling point clock signal with said second clock signal, wherein the received data signal comprises a series of data unit intervals, each data unit interval including a data bit value determined by a voltage level occurring between two sequential transition edges, and wherein utilizing the second clock signal to identify said optimal sample point phase comprises:

generating said second clock signal such that a phase of said second clock signal is equal to a sampling point phase that is between a first data eye edge phase and a first data eye edge phase; and systematically adjusting said phase of said second clock signal and generating a bit error rate value for each said systematically adjusted phase and identifying said optimal sample point phase based on said systematically generated bit error rate values.

12. A clock and data recovery (CDR) module comprising:

a clock generation circuitry configured to generate an edge clock signal in response to a received data signal, to generate a primary sampling point clock signal, and to generate a second clock signal according to an identified optimal sample point phase; and a closed-loop clock alignment circuit including:

a high-speed phase mixer circuit including a first input terminal coupled to receive the primary sampling point clock signal and a second input terminal coupled to receive a phase correction signal;

a multiplexer having a first input terminal coupled to an output terminal of the high-speed phase mixer circuit and a second input terminal coupled to receive the second clock signal;

a phase detector circuit having a first input terminal coupled to an output terminal of the multiplexer and a second input terminal coupled to receive the edge clock signal, wherein the phase detector circuit is configured to generate a phase detection signal based on a phase difference between the edge clock signal and one of said primary sampling point clock signal and said second clock signal received from the MUX;

a comparator circuit having an input terminal coupled to an output terminal of the phase detector circuit, said comparator circuit being configured to store a first said phase detection signal in a first storage element and a second said phase detection signal in a second storage element, and being further configured to generate a comparison signal based on a phase difference between said first and second phase detection signals; and a digital phase control circuit configured to generate said phase correction signal in response to the comparison signal generated by the comparator circuit, with the phase correction signals being transmitted to second input terminal of the high-speed phase mixer circuit.

13. The CDR module of claim 12, wherein the phase detector circuit comprises a differential exclusive-OR (XOR) circuit configured to generate an output voltage that varies in accordance with said phase difference between the edge clock signal and one of said primary sampling point clock signal and said second clock signal received from the MUX.

14. The CDR module of claim 12, wherein the digital phase control circuit comprises a finite state machine.

15. An EDA software tool configured to instantiate, when implemented on a computer, a clock and data recovery (CDR) module into a circuit design, wherein the CDR module is operably implemented in a transceiver of the circuit design, wherein the transceiver includes a decision circuit configured to process a data signal received from an upstream circuit of the integrated circuit of said circuit design and to transmit corresponding data values to a downstream circuit of the circuit design, wherein generating said corresponding data values involves sampling said data signal in accordance with a sampling point phase of a primary sampling point clock signal, and wherein said CDR module is operably configured to perform operations comprising:

utilizing a closed-loop clock alignment circuit to align said sampling point phase of said primary sampling point clock signal with a designated initial sampling point phase;

utilizing a second clock signal to identify an optimal sample point phase while maintaining the alignment of the sampling point phase with said designated initial sampling point phase and generating said corresponding data values using said primary sampling point clock signal;

setting said second clock signal in accordance with said identified optimal sample point phase; and utilizing said closed-loop clock alignment circuit to re-align said primary sampling point clock signal with said second clock signal such that alignment of the sampling point phase is modified from said initial sampling point phase to said optimal sampling point phase.

16. The EDA software tool of claim 15, wherein said operations further comprise:

utilizing said closed-loop clock alignment circuit to align said sampling point phase of said primary sampling point clock signal with a designated initial sampling point phase; and maintaining the alignment of the sampling point phase of said primary sampling point clock signal with said designated initial sampling point phase until said setting of said second clock signal in accordance with said identified optimal sample point phase.

17. The EDA software tool of claim 16, wherein aligning the sampling point phase of said primary sampling point clock signal with said initial clock signal comprises:

performing a first operation including generating a first phase value based on a difference between the primary sampling point clock signal and said edge clock signal;

performing a second operation including generating a second phase value based on a difference between the initial clock signal and said edge clock signal;

performing a third operation including generating an initial phase correction signal based on a difference between the first and second phase values, and then modifying the primary sampling point clock signal using the initial phase correction signal; and repeating the first, second and third operations until the sampling point phase of the primary sampling point clock signal is aligned with the initial clock signal.

18. The EDA software tool of claim 17, wherein utilizing the phase correction signal to modify the primary sampling point clock signal comprises utilizing a high-speed mixer to combine the primary sampling point clock signal with said phase correction signal.

19. The EDA software tool of claim 17, wherein utilizing said closed-loop clock alignment circuit to align said primary sampling point clock signal with said second clock signal comprises:

performing a fourth operation including generating a third phase value based on a difference between the primary sampling point clock signal and said edge clock signal;

performing a fifth operation including generating a fourth phase value based on a difference between the second clock signal and said edge clock signal;

performing a sixth operation including generating a second phase correction signal based on a difference between the third and fourth phase values, and then modifying the primary sampling point clock signal using the second phase correction signal; and repeating the fourth, fifth and sixth operations until the primary sampling point clock signal is aligned with the second clock signal.

* * * * *